United States Patent
Barrenscheen et al.

(10) Patent No.: US 9,490,244 B2
(45) Date of Patent: Nov. 8, 2016

(54) INTEGRATED CIRCUIT COMPRISING A CLAMPING STRUCTURE AND METHOD OF ADJUSTING A THRESHOLD VOLTAGE OF A CLAMPING TRANSISTOR

(71) Applicant: Infineon Technologies Austria AG, Villach (AT)

(72) Inventors: Jens Barrenscheen, Munich (DE); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/707,430

(22) Filed: May 8, 2015

(65) Prior Publication Data
US 2015/0326217 A1 Nov. 12, 2015

(30) Foreign Application Priority Data

May 8, 2014 (DE) .................. 10 2014 106 486

(51) Int. Cl.
*H01L 27/02* (2006.01)
*H03K 17/16* (2006.01)

(52) U.S. Cl.
CPC ......... *H01L 27/0266* (2013.01); *H03K 17/165* (2013.01)

(58) Field of Classification Search
CPC .... H01L 27/0266; H02H 9/04; H02H 9/043; H02H 9/046; H03K 17/165
See application file for complete search history.

(56) References Cited

U.S. PATENT DOCUMENTS

| | | | | |
|---|---|---|---|---|
| 5,162,966 A | * | 11/1992 | Fujihira | H01L 27/0251 257/140 |
| 5,347,169 A | * | 9/1994 | Preslar | H03K 17/165 327/110 |
| 5,812,006 A | * | 9/1998 | Teggatz | H03K 17/0822 327/309 |
| 6,087,877 A | * | 7/2000 | Gonda | H03K 5/08 327/110 |
| 7,129,759 B2 | * | 10/2006 | Fukami | H03K 17/063 327/110 |
| 7,889,529 B2 | * | 2/2011 | Asai | H02M 7/5387 323/284 |
| 8,289,669 B2 | * | 10/2012 | Nakahara | H03K 17/0822 361/91.1 |
| 2012/0049923 A1 | | 3/2012 | Nishimura et al. | |
| 2014/0092508 A1 | | 4/2014 | Ko et al. | |

\* cited by examiner

*Primary Examiner* — Jeffrey Zweizig
(74) *Attorney, Agent, or Firm* — Murphy, Bilak & Homiller, PLLC (57) ABSTRACT

An integrated circuit comprises a load transistor including first and second load terminals and a load control terminal. The integrated circuit further comprises a clamping structure. The clamping structure comprises a clamping transistor, the clamping transistor including first and second clamping transistor load terminals and a gate terminal. The clamping transistor is electrically coupled between the load control terminal and the first load terminal and a clamping voltage of the load transistor is determined by a threshold voltage Vth of the clamping transistor.

22 Claims, 6 Drawing Sheets

INTEGRATED CIRCUIT COMPRISING A CLAMPING STRUCTURE AND METHOD OF ADJUSTING A THRESHOLD VOLTAGE OF A CLAMPING TRANSISTOR

RELATED APPLICATION

The present application claims priority to German (DE) patent application serial no. 102014106486.0, filed 8 May 2014.

BACKGROUND

In integrated circuits including switching devices such as field effect transistors (FETs), insulated gate bipolar transistors (IGBTs), bipolar junction transistors (BJTs), junction field effect transistors (JFETs), and interconnections of switching devices such as half-bridge or full-bridge driver circuits, extreme operation conditions such as overcurrent, overvoltage or short circuit may arise during switching off. Extreme operations conditions such as high voltage spikes, for example, may lead to device destruction or malfunction.

It is desirable to improve robustness of integrated circuits with respect to extreme operation conditions.

SUMMARY

According to an embodiment of an integrated circuit, the integrated circuit comprises a load transistor including first and second load terminals and a load control terminal. The integrated circuit further comprises a clamping structure comprising a clamping transistor. The clamping transistor includes first and second clamping transistor load terminals and a control gate terminal. The clamping transistor is electrically coupled between the load control terminal and the first load terminal and a clamping voltage of the load transistor is determined by a threshold voltage Vth of the clamping transistor.

Another embodiment relates to a method of adjusting a threshold voltage Vth of a clamping transistor, the clamping transistor including first and second clamping transistor load terminals and a control gate terminal, wherein the clamping transistor is electrically coupled between a load control terminal and a first load terminal of a load transistor and includes a tunnel dielectric arranged between a charge storage structure and a semiconductor body, and a gate dielectric arranged between a control gate electrode and the charge storage structure. The method includes measuring the threshold voltage of the clamping transistor. The method further includes adjusting the threshold voltage Vth of the clamping transistor by altering a charge of the charge storage structure.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
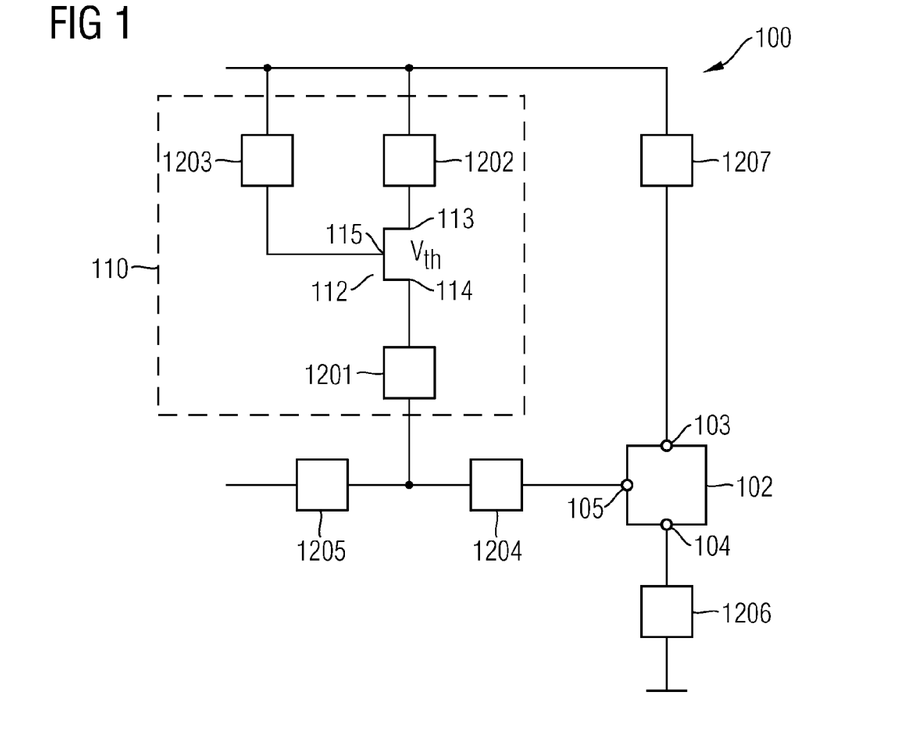
FIG. 1 is a schematic circuit diagram of an embodiment of an integrated circuit comprising a load transistor and a clamping structure.

In FIG. 1 a circuit diagram of an integrated circuit 100 according to an embodiment is disclosed. The integrated circuit 100 comprises a load transistor 102 including first and second load terminals 103, 104 and a load control terminal 105. A clamping structure 110 of the integrated circuit 100 comprises a clamping transistor 112, the clamping transistor 112 including first and second clamping transistor load terminals 113, 114 and a clamping transistor gate terminal 115. The clamping transistor 112 is electrically coupled between the load control terminal 105 and the first load terminal 103 and a clamping voltage of the load transistor is determined by a threshold voltage Vth of the clamping transistor 112.

The integrated circuit may further include optional circuit elements 1201 . . . 1207. Some of these circuit elements 1201 . . . 1207 may form part of the clamping structure 110. According to an embodiment, the circuit element 1201 is a diode and the second clamping transistor load terminal 114 is electrically coupled to the load control terminal 105 via the diode. According to yet another embodiment, the circuit element 1202 is a resistor electrically coupled to the first clamping transistor load terminal 113. According to yet another embodiment, the circuit element 1203 is a resistor electrically coupled to the clamping transistor gate terminal 115. According to another embodiment, the circuit elements 1204, 1205, 1206 include resistors. The circuit element 1205 may further include a gate driver circuit, for example.

According to an embodiment, the load transistor 102 is an insulated gate field effect transistor (IGFET) such as a metal oxide semiconductor field effect transistor (MOSFET). According to another embodiment, the load transistor 102 is an insulated gate bipolar transistor (IGBT). According to yet another embodiment, the load transistor 102 is a bipolar junction transistor (BJT). According to yet another embodiment, the load transistor 102 is a junction field effect transistor (JFET).

According to an embodiment, the clamping structure 110 is configured to clamp a voltage between the first load terminal 103 and the second load terminal 104 by turn-on of the clamping transistor 112 above the threshold voltage Vth between the clamping transistor gate terminal 115 and the second clamping transistor load terminals 114 and thus changing the potential at the load control terminal 105 in a direction of turning-on the load transistor 102.

According to an embodiment, the threshold voltage Vth ranges between 70% and 99% of a breakdown voltage Vbr1 of the load transistor between the first and second load terminals 103, 104.

According to an embodiment, a breakdown voltage Vbrc of the clamping transistor 112 between the first and second clamping transistor load terminals 113, 114 at a turned-off gate is greater than the threshold voltage Vth. Thereby, electric breakdown between the first and second clamping transistor load terminals 113, 114, e.g., avalanche breakdown, can be avoided due to turn-on of the clamping transistor 112.

According to an embodiment, the breakdown voltage Vbrc of the clamping transistor 112 between the first and second clamping transistor load terminals 113, 114 at turned-off gate is greater than 90% of the breakdown voltage Vbr1 of the load transistor 102 between the first and second load terminals 103, 104. According to an embodiment, the breakdown voltage refers to a nominal breakdown voltage as specified in product or data sheets. The specified breakdown voltage may be slightly smaller, e.g., by 10% to 20%, than a voltage of actual electric breakdown.

According to an embodiment, the clamping transistor 110 comprises a control gate electrode electrically connected to the clamping transistor gate terminal 115 and a charge storage structure between the control gate electrode and a semiconductor body. A tunnel dielectric may be arranged between the charge storage structure and the semiconductor body, and a gate dielectric may be arranged between the control gate electrode and the charge storage structure. A thickness of the tunnel dielectric may range between 3 nm and 15 nm, and a thickness of the control gate dielectric may range between 150 nm and 30 μm, for example. According to an embodiment, the charge storage structure is one of a floating gate electrode and a silicon nitride layer.

According to an embodiment, the threshold voltage Vth of the clamping transistor is greater than 30 V. The threshold voltage Vth may be adjusted with respect to a voltage blocking requirement of the load transistor 102 and may be smaller, e.g., by 2% to 10%, than the voltage blocking capability, e.g., specified reverse blocking voltage of the load transistor 102, e.g., smaller by 2% to 10% than 40 V, or smaller by 2% to 10% than 500 V, or smaller by 2% to 10% than 600 V, or smaller by 2% to 10% than 900 V, or smaller by 2% to 10% than 1200 V, or smaller by 2% to 10% than 1700 V, or smaller by 2% to 10% than 2500 V, or smaller by 2% to 10% than 3300 V, or smaller by 2% to 10% than 4500 V, or smaller by 2% to 10% than 6500 V, by way of example.

According to an embodiment, the clamping transistor 112 comprises an edge termination structure of at least one of field plates, doped ring structures, variation of lateral doping structures (VLD structure), junction termination extension structures (JTE structures), trench structures. The clamping transistor and the load transistor may include a same type of edge termination structure.

According to an embodiment, the circuit element 1201 includes a sense resistor electrically coupled between the second clamping transistor load terminal 114 and the load control terminal 105. The integrated circuit 100 may further comprise a current sense circuit electrically coupled to the sense resistor, the current sense circuit being configured to detect a current through the sense resistor.

Figure 2:
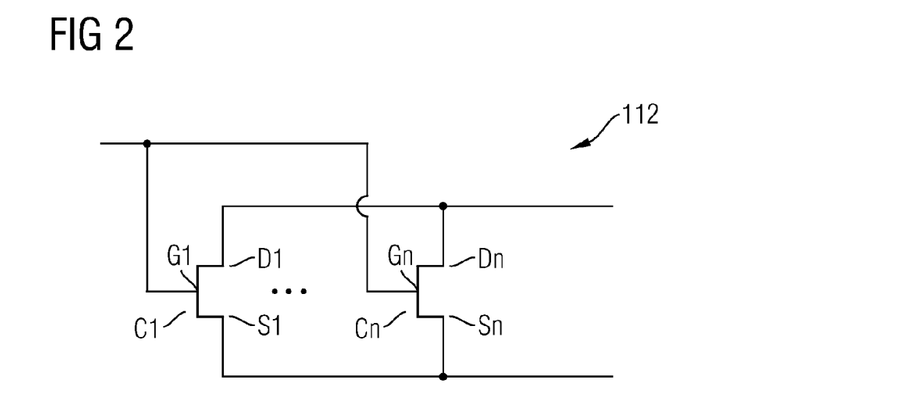
FIG. 2 illustrates a clamping transistor including a plurality of clamping transistor cells C1 . . . Cn connected in parallel.

As is illustrated in an embodiment of a schematic circuit diagram of FIG. 2, the clamping transistor 112 includes a plurality of clamping transistor cells C1 . . . Cn, n>1, each of the clamping transistor cells C1 . . . Cn including first and second clamping transistor cell load terminals D1 . . . Dn, S1 . . . Sn and a control gate cell terminal G1 . . . Gn. The first clamping transistor cell load terminals D1 . . . Dn are electrically connected, e.g., by a conductive structure such as a metal structure including contacts and wiring lines, for example. The second clamping transistor cell load terminals S1 . . . Sn are electrically connected, e.g., by a conductive structure such as a metal structure including contacts and wiring lines, for example. Likewise, the control gate cell terminals G1 . . . Gn are electrically connected, e.g., by a conductive structure such as a metal structure including contacts and wiring lines, for example. The clamping transistor may be formed by a sequence of interconnected clamping transistor cells.

According to another embodiment, the load transistor 102 and the clamping transistor 112 are vertical transistors including one load terminal, e.g., a source or emitter at a first side of a semiconductor body and the other load terminal, e.g., a drain or collector at a second side of the semiconductor body opposite to the first side. In a vertical transistor, load current flow occurs between the first side and the second side. By way of example, clamping transistor cells of the clamping transistor may share a continuous metal layer or metal layer stack as a drain terminal at the second side, e.g., a rear side of the semiconductor body. At the first side, e.g., a front side of the semiconductor body, gate and source terminals may be arranged. The transistor cells, e.g., transistor cells C1 . . . Cn, may be shaped as stripes, segments of stripes, circles, ellipsoids, polygons, e.g. squares, rectangles, hexagons, octagons, for example.

The embodiments described with respect to FIGS. 1 and 2 allow for a precise voltage clamping of the load transistor 102. Voltage detection by potential dividers and/or zener diode chains, and, undesired impact by cross-currents, fluctuations of breakdown voltage of zener diode chains caused by process fluctuations or temperature may be reduced or avoided, since clamping functionality is triggered by turn-on of the clamping transistor.

Figure 3:
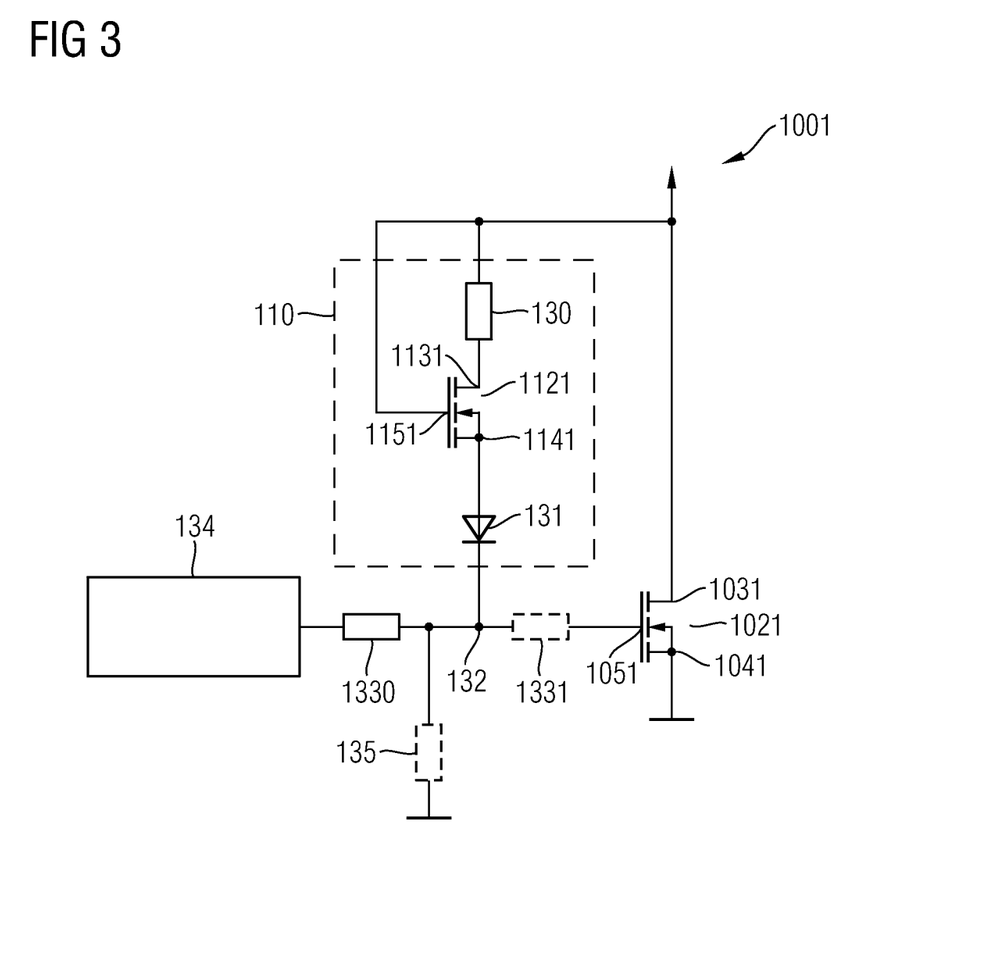
FIG. 3 is a schematic circuit diagram illustrating one embodiment of an integrated circuit including a load transistor and a clamping structure.

The schematic circuit diagram illustrated in FIG. 3 relates to one embodiment of an integrated circuit 1001. The integrated circuit 1001 includes an n-type channel load FET 1021, being one example of the load transistor 102 illustrated in FIG. 1. The n-type channel load FET 1021 includes a load FET drain terminal 1031, a load FET source terminal 1041, and a load FET gate terminal 1051, being examples for the first and second load terminals 103, 104 and the load control terminal 105 of the load transistor 102 illustrated in FIG. 1.

The clamping structure 110 of the integrated circuit 1001 includes an n-type channel clamping FET 1121, being one example of the clamping transistor 112 illustrated in FIG. 1. The n-type channel clamping FET 1121 includes a clamping FET drain terminal 1131, a clamping FET source terminal 1141, and a clamping FET gate terminal 1151, being examples of the first and second clamping transistor load terminals 113, 114 and the clamping transistor gate terminal 115 illustrated in FIG. 1. The n-type channel clamping FET 1121 includes an adjustable threshold voltage Vthc. The threshold voltage Vthc is greater than 30 V and may be adjusted with respect to the voltage blocking requirement of the n-type channel load FET 1021. According to an embodiment, the threshold voltage Vthc may be adjusted during production tests, for example. The clamping structure 110 further includes a resistor 130 and a diode 131. The resistor 130, the n-type channel clamping FET 1121 and the diode 131 are electrically connected in series. Monolithic integration of the resistor 130, the n-type channel clamping FET 1121 and the diode 131 allows for a reduction of printed circuit board (PCB) area requirement as well as a reduction of a failure probability due to poor electric connections such as cold solder joints, for example.

When a voltage between the clamping FET gate terminal 1151 and the clamping FET source terminal 1141 exceeds the threshold voltage Vthc, e.g., upon the appearance of overvoltage(s), the n-type channel clamping FET 1121 is turned-on and clamps a voltage between the load FET drain terminal 1031 and the load FET source terminal 1041, via a turn-on of the load FET gate 1051. The resistor 130 acts as a current limiting element. A channel width of the n-type channel clamping FET 1121 may be chosen small enough for adjusting a low short circuit current level. The resistor 130 is one example of the circuit element 1202 illustrated in FIG. 1. The diode 131 hinders discharge of the load FET gate terminal 1051 in an on-state of the n-type channel load FET 1021. In the on-state, a voltage at the load FET gate terminal 1051 may be greater than a voltage at the load FET drain terminal 1031. In the embodiment illustrated in FIG. 3, the n-type channel load FET 1021 illustrates one example of the load transistor 102 of FIG. 1. According to other embodiments, the load transistor 102 may be a BJT, IGBT or JFET. 20. According to an embodiment, the load transistor 102 is a power transistor conducting currents greater than 2 A in an on-state transistor mode.

The clamping structure 110 may be electrically coupled to a node 132 at a side of a first gate resistor 1330 directed to the n-type channel load FET 1021. According to an embodiment, an overall gate resistor may be split into a plurality of gate resistors, e.g., the first gate resistor 1330 and an optional second gate resistor 1331. This allows for an implementation of a low pass filter function having the node 132 between the first and second gate resistors 1330, 1331.

According to an embodiment, the breakdown voltage Vbdc of the n-type channel clamping FET 1121 between the clamping FET drain terminal 1131 and the clamping FET source terminal 1141 at a turned-off clamping FET gate terminal 1151 is greater than the threshold voltage Vthc. At rising voltages between the clamping FET gate terminal 1151 and the clamping FET source terminal 1141, the n-type channel clamping FET 1121 turns into a conductive mode by exceeding the threshold voltage Vthc avoiding undesired avalanche breakdown between the clamping FET drain terminal 1131 and the clamping FET source terminal 1141.

According to an embodiment, the breakdown voltage Vbdc of the n-type channel clamping FET 1121 between the clamping FET drain terminal 1131 and the clamping FET source terminal 1141 at turned-off clamping FET gate terminal 1151 is greater than 90% of the breakdown voltage Vbdc of the n-type channel load FET 1021 between the load FET drain terminal 1031 and the load FET source terminal 1041.

The integrated circuit 1001 may further comprise a gate driver circuit 134 and a load transistor gate protection circuit 135.

Figure 4:
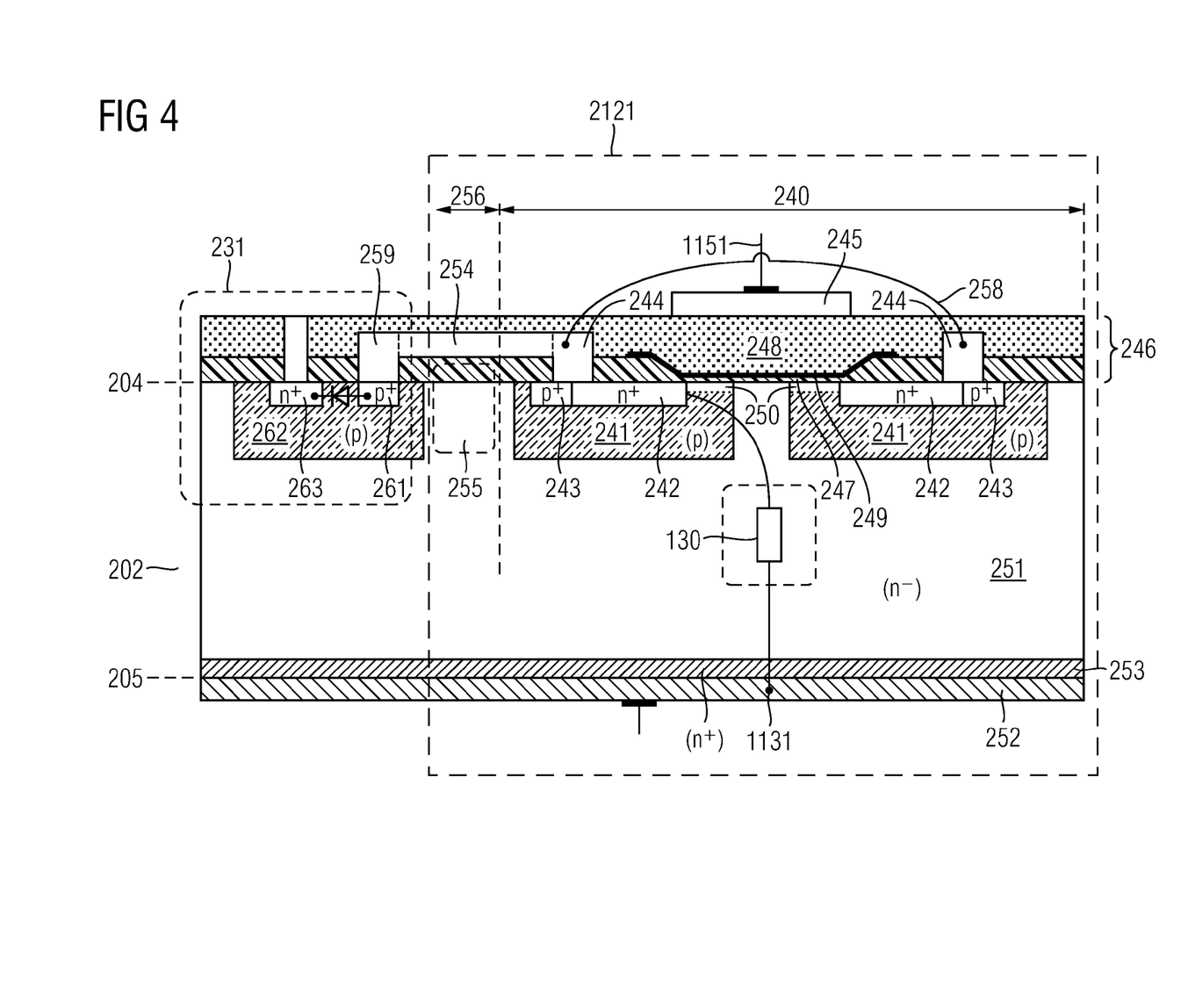
FIG. 4 illustrates one example of a portion of the clamping structure 110 of FIG. 3 as a cross-sectional view through a semiconductor body.

FIG. 4 illustrates a schematic cross-sectional view of a semiconductor body 202 having a first surface 204 and a second surface 205 parallel to the first surface 204. The semiconductor body 202 may be a single-crystalline semiconductor body of, for example, silicon (Si), silicon carbide (SiC), germanium (Ge), silicon germanium (SiGe), gallium nitride (GaN) or gallium arsenide (GaAs). A distance between the first and second surfaces 204, 205 may be in a range of several tens of micrometers to several hundreds of micrometers depending upon, for example, a blocking voltage requirement of the load transistor 102. A normal direction to the first and second surfaces 204, 205 defines a vertical direction and directions perpendicular to the vertical direction are lateral directions.

The cross-sectional view of FIG. 4 illustrates one example of a portion of the clamping structure 110 of FIG. 3. The example of a portion of the n-type channel clamping FET 1121 of FIG. 3 is illustrated as an n-type channel clamping FET portion 2121. In a cell area 240 the semiconductor body 202 includes p-type body regions 241 adjoining the first surface 204. The semiconductor body 202 further includes n+-type source regions 242 and p+-type body contact regions 243. Electrical contacts 244 are electrically coupled to the n+-type source regions 242 and are further electrically coupled to the p-type body regions 241 via the p+-type body contact regions 243. The electrical contacts 244 are electrically connected to a wiring 254, being, for example, part of a patterned metallization layer.

A control gate electrode 245 is electrically isolated from the semiconductor body 202 by a dielectric structure 246. The dielectric structure 246 includes a tunnel dielectric 247 and a gate dielectric 248. The tunnel dielectric 247 is arranged between a charge storage structure 249 and the semiconductor body 202, and the gate dielectric 248 is arranged between the control gate electrode 245 and the charge storage structure 249.

According to an embodiment, the charge storage structure 249 is a silicon nitride layer. According to another embodiment, the charge storage structure 249 is a floating gate electrode, e.g., a polysilicon floating gate electrode. According to an embodiment, a thickness of the tunnel dielectric 247 ranges between 3 nanometer and 15 nanometer, in the case of a thermally grown oxide, and a thickness of the gate dielectric 248 ranges between 150 nanometer and 30 micrometer. The thickness of the gate dielectric may be appropriately adjusted with respect to a maximum blocking voltage in an operation mode. A channel region 250 is located in the p-type body region 241 at the first surface 204 facing the charge storage structure 249. An n--type drift region 251 is located between the first and second surfaces 204, 205 in the semiconductor body 202. The n--type drift region 251 is electrically coupled to a drain electrode 252 at the second surface 205 by an n+-type drain region 253. A doping concentration of the n--type drift region 251 may correspond to a basic doping concentration of a substrate material, e.g., a wafer, or may correspond to a doping concentration of a semiconductor layer formed on a substrate, for example.

In an on-state of the n-type channel clamping FET portion 2121, a current flows between the n+-type source regions 242 and the n+-type drain region 253 through the channel region 250 and the n--type drift region 251. In the n-type channel clamping FET portion 2121, the resistor 130 illustrated in FIG. 3 may be determined by a path resistance of the n--type drift region 251. A resistance value of the resistor may be determined by a number of clamping transistor cells, specific resistance and dimensions such as thickness of the of the n--type drift region 251, for example.

The cell area 240 is surrounded or at least partly surrounded by an edge termination structure 255 in an edge termination area 256 that surrounds or at least partly surrounds the cell area 240. The edge termination structure 255 may include at least one of field plates, doped ring structures, variation of lateral doping structures, junction termination extension structures and trench structures, for example.

The n+-type source regions 242 are electrically coupled to a pn-junction diode 231 via the electrical contacts 244, the wiring 254 and a contact 259. The pn-junction diode includes a p+-type anode contact region 261, a p-type anode region 262 and an n+-type cathode region 263. By way of example, the n+-type cathode region 263 and the n+-type source regions 242 may be processed together. Likewise, the p-type anode region 262 and the p-type body regions 241 may be processed together. Likewise, the p+-type anode contact region 261 and the p+-type body contact region 243 may be processed together. Semiconductor regions processed together include same vertical dimensions and dopant profiles, for example. Distinct or separate source regions 242 and p-type body regions 241 may be shorted by a wiring 258. The wirings 254, 258 may be parts of a patterned metallization layer or layer stack, for example.

In the embodiment illustrated in FIG. 4, the diode 131 of FIG. 3 is formed as the pn-junction diode 231. According to other embodiments, the diode 131 may be a Schottky diode. According to other embodiments, a series connection of Schottky and/or pn-junction diodes may be used. The voltage blocking capability of the diode(s) may be adjusted with respect to a maximum voltage at the load FET gate terminal 1051.

After forming the clamping structure 110 as illustrated in the schematic cross-sectional view of FIG. 4, the threshold voltage Vthc of the n-type channel clamping FET 1121 may be adjusted by measuring the threshold voltage Vthc, and, subsequently, altering a charge of the charge storage structure 249 by allowing electrons to tunnel through the tunnel dielectric 247 between the charge storage structure 249 and the semiconductor body 202, e.g., by applying a voltage to the control gate electrode 245. By repeating the sequence of measuring the threshold voltage Vthc and altering the charge of the charge storage structure 249 by electrons tunneling through the tunnel dielectric 247, desired values of the threshold voltage Vthc may be adjusted.

The functionality of the clamping structure 110 is maintained even in case of a failure of a driving circuit such as a blackout of an auxiliary power supply.

Further embodiments based on the clamping structure 110 illustrated in FIG. 3 are described below.

Figure 5A:
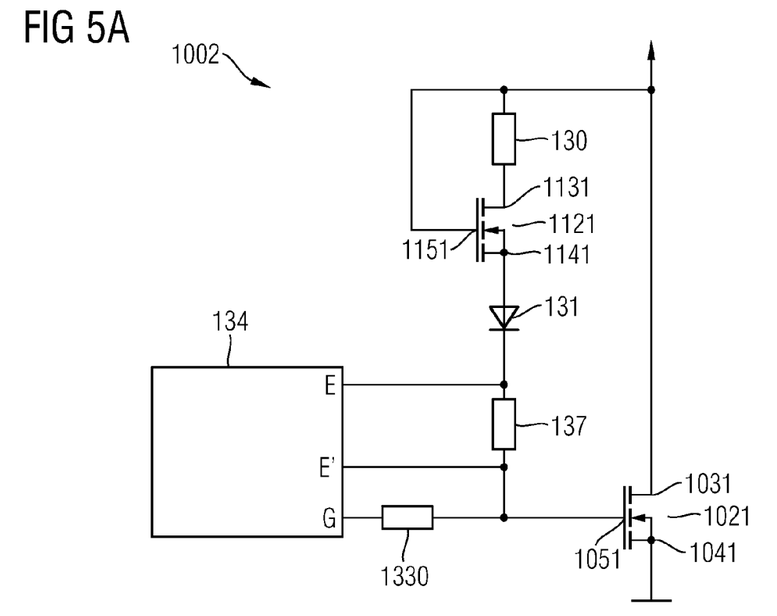
FIGS. 5A, 5B, 6, 7, and 8 are each a schematic circuit diagram, illustrating different embodiments of an integrated circuit including a load transistor and a clamping structure.

An integrated circuit 1002 illustrated in the schematic circuit diagram of FIG. 5A further comprises a sense resistor 137 electrically coupled between the clamping FET source terminal 1141 and the load FET gate terminal 1051. A voltage drop across the sense resistor 137 is detected by a current sense circuit being part of the gate driver circuit 134.

In an on-state of the n-type channel clamping FET 1121, a voltage at an input E of the gate driver circuit 134 exceeds a voltage at an output G of the gate driver circuit G, even without initiation of a turn-off process of the n-type channel load FET 1021. By sensing the voltage drop across the sense resistor 137 via input terminals E, E' of the gate driver circuit 134, turn-on of the clamping structure 110 may be determined regardless of a voltage at the output G of the gate driver circuit 134. The input terminals E, E' may be electrically protected against inadmissible voltages with respect to a reference potential such as ground (GND) by diode(s) such as zener diode(s), for example.

Detection of voltage clamping by the clamping structure 110 may initiate measures by the gate driver circuit 134. For example, a turn-on of the n-type channel load FET 1021 or a short interruption of a load transistor turn-off process may be initiated so that a charge of the clamping structure 110 may be transferred to the load FET gate terminal 1051. When current flow through the sense resistor 137 ends, a voltage drop across the resistor 137 detected via input terminals E, E' decreases and the turn-off process may be continued or restarted. After a fault, the turn-off process may be carried out based on other parameters such as lower gate driver current. In the embodiment illustrated in FIG. 5A, the sense resistor 137 and the input terminal E' are optional.

Figure 5B:
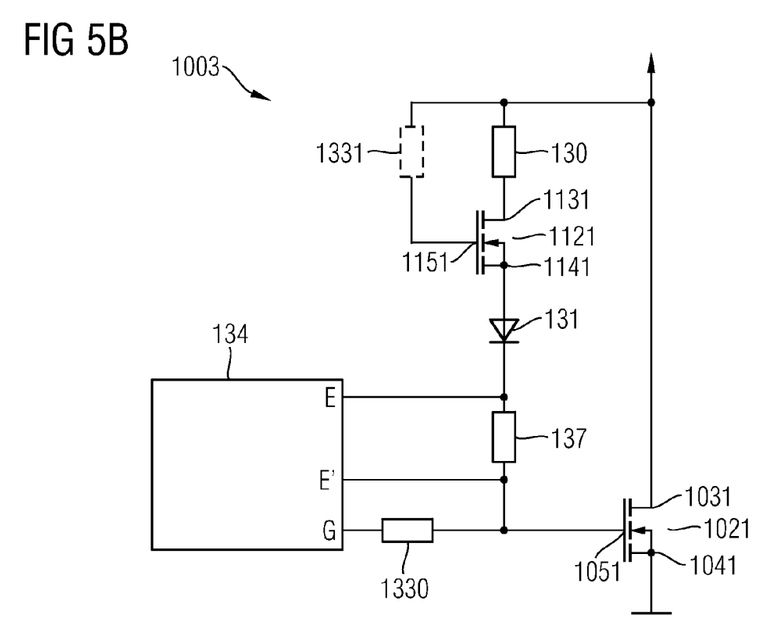

In the embodiment of an integrated circuit 1003 illustrated in FIG. 5B, a clamping FET gate resistor 1331 is electrically coupled to the clamping FET gate terminal 1151. The clamping FET gate resistor 1331 and an input capacitance of the clamping FET 1121 have a low pass filter function that may suppress short-term disturbances. When the voltage between the clamping FET gate terminal 1151 and the second clamping FET load terminal 1141 exceeds the threshold voltage Vthc for a time period determined by the low-pass filter, the clamping process is activated. The circuit functionality may be optimized by appropriately adjusting a resistance of the clamping FET gate resistor 1331.

Figure 6:
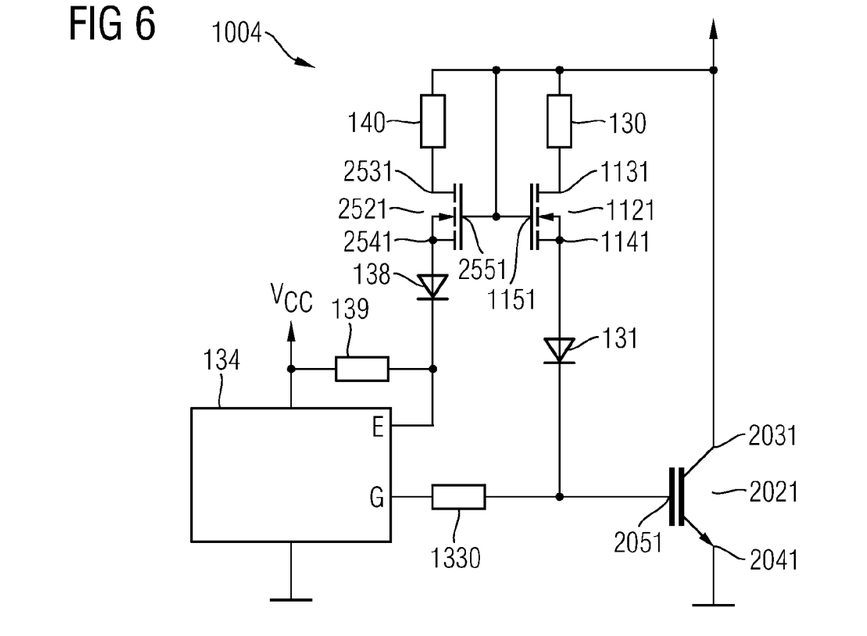

An embodiment of an integrated circuit 1004 providing a feedback of the clamping process to the gate driver circuit 134 is illustrated in the schematic circuit diagram of FIG. 6. The integrated circuit 1004 includes a load IGBT 2021 comprising a load IGBT collector terminal 2031, a load IGBT emitter terminal 2041 and a load IGBT gate terminal 2051. The integrated circuit 1004 further includes an n-type channel sense FET 2521 comprising a sense FET drain terminal 2531, a sense FET source terminal 2541 and a sense FET gate terminal 2551. The sense FET source terminal 2541 is electrically coupled to the input terminal E of the gate driver circuit 134. The input terminal E may be electrically protected against inadmissible voltages with respect to a reference potential such as ground (GND) by diode(s) such as zener diode(s), for example. In case of a high-impedance at the input terminal E, a diode 138 may be dispensed with. If a pull-up resistor 139 is electrically coupled to a reference voltage level Vcc, a series connection of the diode 138 and the sense FET 2521 may be required. A resistor 140 and the input capacitance of the input terminal E act as a low-pass filter allowing to filter short transients that may arise at the input terminal E during normal operation mode due to voltage changes at the sense FET 2521 and the capacitance of the sense FET 2521. A further resistor and a further low-pass filter capacitance may be provided for adjusting the sensitivity of the circuit arrangement. The different electrical coupling of the sense FET source terminal 2541 and the clamping FET source terminal 1141 provides the benefit that at turn-off of the load IGBT 2021, the input terminal E receives a signal before a change in a gate voltage of the load IGBT 2021 occurs. The gate driver circuit 134 may thus be operated in a mode supporting the clamping process, e.g. active turn-on or resistance increase.

When turning off to negative voltage at the gate of the load IGBT 2021, the input terminal E may refer to the negative voltage at turn-off to maintain a same threshold voltage.

The sense FET 2521 and the clamping FET 2021 may have a similar design and cell layout, and may for example differ with respect to the number of FET cells. The FETs 2521, 2021 may be adjusted to different threshold voltages, thereby achieving desired sequence of signals at the input terminal E and the gate of the load transistor.

Figure 7:
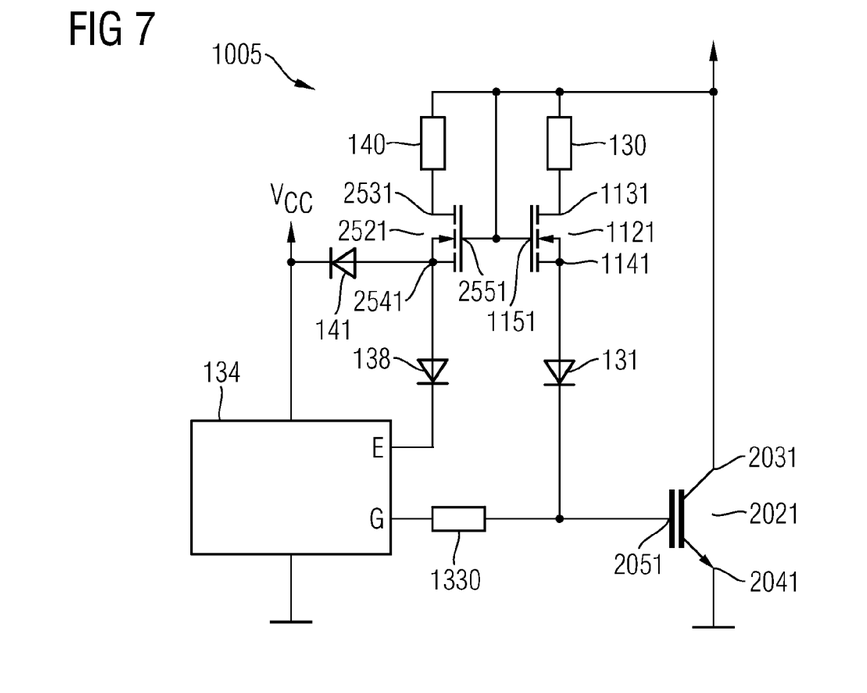

Another embodiment of an integrated circuit 1005 providing a feedback of the clamping process to the gate driver circuit 134 is illustrated in the schematic circuit diagram of FIG. 7. Clamping of a voltage at the input terminal E and thus protection of the input terminal E from unintended high voltages occurs via a diode 141 electrically coupled to the reference voltage level Vcc. Thereby, electric breakdown of diodes such as zener diodes may be avoided. The diode 138 is optional. An additional clamping diode electrically coupled between the clamping FET source terminal 1141 and the reference voltage level Vcc or ground (GND) may be arranged.

Figure 8:
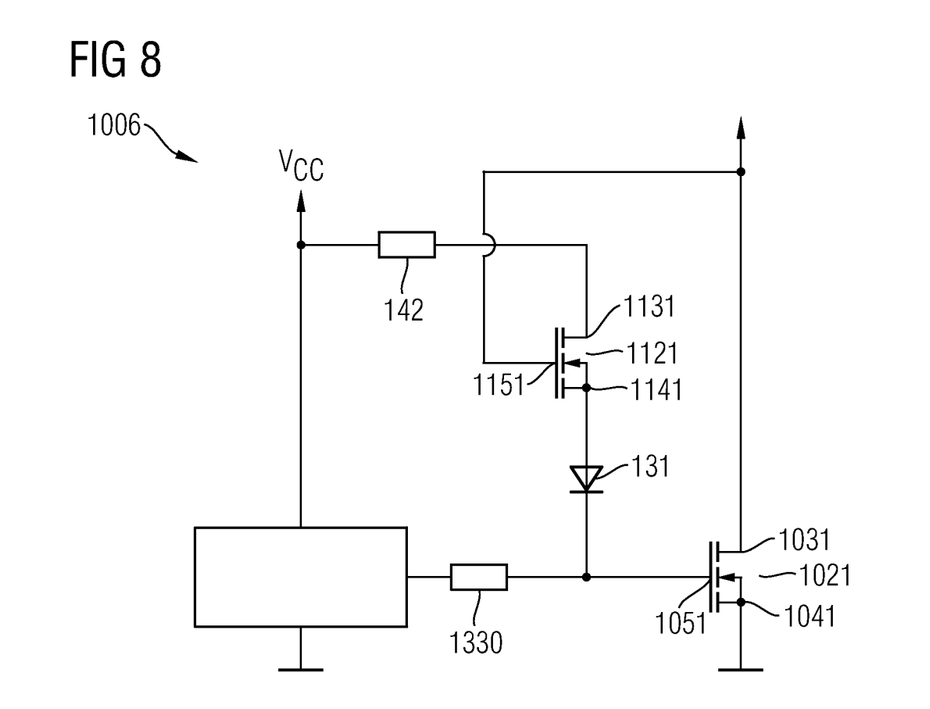

Another embodiment of an integrated circuit 1006 providing a feedback of the clamping process to the gate driver circuit 134 is illustrated in the schematic circuit diagram of FIG. 8. The integrated circuit 1006 allows for avoidance of overvoltages at the gate of the n-type channel load FET 1021.

The load transistor described with respect to any of the above embodiments may be a FET, a BJT, an IGBT or a JFET, for example. The load transistor may be a power transistor conducting currents greater than 2 A in an on-state transistor mode.

Figure 9:
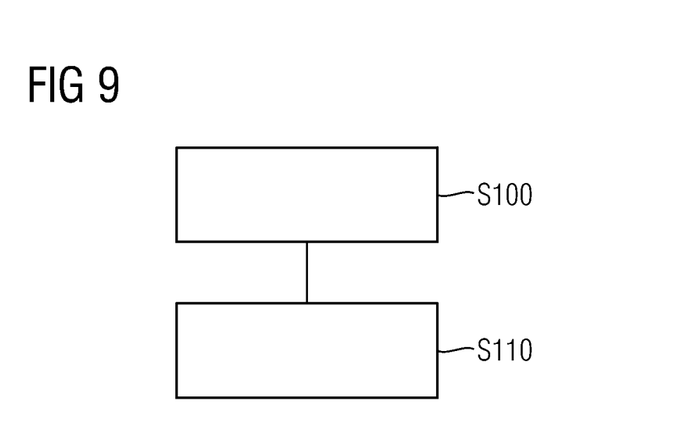
FIG. 9 is a schematic process chart illustrating an embodiment of adjusting a threshold voltage Vth of a clamping transistor.

The schematic process chart of FIG. 9 relates to an embodiment of adjusting a threshold voltage Vth of a clamping transistor, the clamping transistor including first and second clamping transistor load terminals and a control gate terminal. The clamping transistor is electrically coupled between a load control terminal and a first load terminal of a load transistor and includes a tunnel dielectric arranged between a charge storage structure and a semiconductor body, and a gate dielectric arranged between a control gate electrode and the charge storage structure.

Process feature S100 includes measuring the threshold voltage of the clamping transistor.

Process feature S110 includes adjusting the threshold voltage Vth of the clamping transistor by altering a charge of the charge storage structure.

According to an embodiment, prior to process feature S100, a control gate structure of the clamping transistor comprising a gate dielectric arranged between a control gate electrode and the charge storage structure is formed.

The sequence of process features S100, S110 may be repeated until a desired threshold voltage of the clamping transistor has been appropriately adjusted, for example until the threshold voltage lies within a desired voltage range.

The charge of the charge storage structure may be altered by allowing electrons to tunnel through the tunnel dielectric between the charge storage structure and the semiconductor body, e.g., by applying a voltage to the control gate electrode or by applying an appropriate set of voltages to the terminals of the clamping transistor, such as gate, source and drain, that allow the charging or discharging of the gate storage structure.

Absolute values of the voltage at the control gate electrode during adjusting the threshold voltage typically exceed an absolute value of a blocking voltage of the clamping transistor, e.g., by more than 20%, 50%, or even more than 100%.

A voltage at the control gate electrode during adjusting the threshold voltage of the clamping transistor may be applied for a time period shorter than 10 ms, 1 ms, or 0.1 ms, for example.

The change of the threshold voltage of the clamping transistor during one sequence of process step S110 is determined by the value and the duration of the voltage applied to the control gate electrode during adjusting the threshold voltage.

While applying the voltage at the control gate electrode of the clamping transistor, the pn-diode formed by the p-type body regions 241 and the n--type drift region 251 may be operated in a forward mode, i.e., a positive voltage may be applied to p-doped semiconductor regions and a negative voltage may be applied to n-doped semiconductor regions in order to achieve a forward current of a desired value.

The process features S100 and S110 may be performed in the process sequence of manufacturing of the clamping transistor on wafer level, i.e., when the single chips of the clamping transistor are not yet singulated and/or after singulation and packaging of the clamping transistor chips.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
   a load transistor including first and second load terminals and a load control terminal;
   a clamping structure comprising a clamping transistor, the clamping transistor including first and second clamping transistor load terminals and a control gate terminal, wherein the clamping transistor is electrically coupled between the load control terminal and the first load terminal and a clamping voltage of the load transistor is determined by a threshold voltage Vth of the clamping transistor, and wherein the clamping transistor comprises a control gate electrode electrically connected to the control gate terminal and a charge storage structure between the control gate electrode and a semiconductor body.

2. The integrated circuit of claim 1, wherein the clamping structure is configured to clamp a voltage between the first load terminal and the second load terminal by turn-on of the clamping transistor above the threshold voltage.

3. The integrated circuit of claim 1, wherein the threshold voltage ranges between 70% and 99% of a breakdown voltage of the load transistor between the first and second load terminals.

4. The integrated circuit of claim 1, wherein the second clamping transistor load terminal is electrically coupled to the load control terminal via an intervening diode.

5. The integrated circuit of claim 4, wherein the first clamping transistor load terminal is electrically coupled to the control gate terminal via an intervening resistor.

6. The integrated circuit of claim 5, wherein the load transistor, the clamping transistor, the intervening diode and the intervening resistor are monolithically integrated.

7. The integrated circuit of claim 4, further comprising a load control resistor electrically coupled between the intervening diode and the load control terminal.

8. The integrated circuit of claim 1, wherein a breakdown voltage of the clamping transistor between the first and second clamping transistor load terminals at turned-off control gate is greater than 90% of a breakdown voltage of the load transistor between the first and second load terminals.

9. The integrated circuit of claim 1, wherein a tunnel dielectric is arranged between the charge storage structure and the semiconductor body, and a gate dielectric is arranged between the control gate electrode and the charge storage structure.

10. The integrated circuit of claim 9, wherein a thickness of the tunnel dielectric ranges between 3 nm and 15 nm, and a thickness of the gate dielectric ranges between 150 nm and 30 μm.

11. The integrated circuit of claim 1, wherein the charge storage structure is one of a floating gate electrode and a silicon nitride layer.

12. The integrated circuit of claim 1, wherein the threshold voltage Vth of the clamping transistor is greater than 30 V.

13. The integrated circuit of claim 1, wherein the clamping transistor includes a plurality of clamping transistor cells, each clamping transistor cell including first and second clamping transistor cell load terminals and a control gate cell terminal, the first clamping transistor cell terminals being electrically connected, the second clamping transistor cell terminals being electrically connected and the control gate cell terminals being electrically connected.

14. The integrated circuit of claim 1, wherein the clamping transistor comprises an edge termination structure of at least one of field plates, doped ring structures, variation of lateral doping structures, junction termination extension structures, trench structures.

15. The integrated circuit of claim 14, wherein the clamping transistor and the load transistor include a same type of edge termination structure.

16. The integrated circuit of claim 1, further comprising a sense resistor electrically coupled between the second clamping transistor load terminal and the load control terminal; and further comprising a current sense circuit electrically coupled to the sense resistor, the current sense circuit being configured to detect a current through the sense resistor.

17. The integrated circuit of claim 1, wherein the load transistor and the clamping transistor are vertical transistors including one load terminal at a first side of a semiconductor body and the other load terminal at a second side of the semiconductor body opposite to the first side.

18. The integrated circuit of claim 1, wherein the load transistor is a power transistor conducting current greater than 2 A in an on-state transistor mode.

19. An integrated circuit, comprising:
  a load transistor including first and second load terminals and a load control terminal;
  a clamping structure comprising a clamping transistor, the clamping transistor including first and second clamping transistor load terminals and a control gate terminal, wherein the clamping transistor is electrically coupled between the load control terminal and the first load terminal and a clamping voltage of the load transistor is determined by a threshold voltage Vth of the clamping transistor, and wherein a breakdown voltage of the clamping transistor between the first and second clamping transistor load terminals at a turned-off gate is greater than the threshold voltage Vth.

20. A method of adjusting a threshold voltage Vth of a clamping transistor, the clamping transistor including first and second clamping transistor load terminals and a control gate terminal, wherein the clamping transistor is electrically coupled between a load control terminal and a first load terminal of a load transistor and includes a tunnel dielectric arranged between a charge storage structure and a semiconductor body, and a gate dielectric arranged between a control gate electrode and the charge storage structure, the method comprising:
  measuring the threshold voltage of the clamping transistor; and
  adjusting the threshold voltage Vth of the clamping transistor by altering a charge of the charge storage structure.

21. The method of claim 20, further comprising, prior to measuring the threshold voltage, forming the tunnel dielectric, the charge storage structure, the gate dielectric and the control gate electrode.

22. The method of claim 20, wherein the threshold voltage Vth is adjusted to a value greater than 30V.

* * * * *